(12) United States Patent
Lee et al.

(10) Patent No.: US 6,881,626 B2
(45) Date of Patent: Apr. 19, 2005

(54) METHOD OF FABRICATING A NON-VOLATILE MEMORY DEVICE WITH A STRING SELECT GATE

(75) Inventors: Chany-Hyun Lee, Suwon (KR); Jung-Dal Choi, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/866,467

(22) Filed: Jun. 10, 2004

(65) Prior Publication Data

US 2004/0235233 A1 Nov. 25, 2004

Related U.S. Application Data

(62) Division of application No. 10/330,851, filed on Dec. 26, 2002, now Pat. No. 6,774,433.

(30) Foreign Application Priority Data

Dec. 27, 2001 (KR) .................................. 2001-85990

(51) Int. Cl.[7] ............................................. H01L 21/336
(52) U.S. Cl. ...................... 438/257; 438/279; 438/294
(58) Field of Search .............................. 438/257, 279, 438/294, 264, 266

(56) References Cited

U.S. PATENT DOCUMENTS 5,471,423 A 11/1995 Iwasa
6,107,126 A 8/2000 Wu
6,452,232 B1 9/2002 Adan
6,576,513 B1 * 6/2003 Yim et al. .................. 438/257
6,777,294 B1 * 8/2004 Park ........................... 438/264
2003/0148583 A1 8/2003 Adachi et al.

* cited by examiner

Primary Examiner—Brad Smith
(74) Attorney, Agent, or Firm—Marger Johnson & McCollom, P.C.

(57) ABSTRACT

A non-volatile memory device includes a bitline area, a string selection transistor, a plurality of memory transistors, a ground selection transistor, and a source area which are serially disposed. The memory transistors are silicon-oxide-nitride-oxide-silicon (SONOS) transistors having a multi-layered charge storage layer. The memory transistors are also depletion mode transistors having a negative threshold voltage. In a method of fabricating the non-volatile memory device, a first conductive type diffusion layer is formed at a predetermined area of a first conductive type substrate. Impurities of a second conductive type are implanted into a predetermined area of a surface of the substrate where the first conductive type diffusion layer is formed, thereby forming an inversely doped area at a surface of the first conductive type diffusion layer. A string selection gate, a plurality of memory gates, and a ground selection gate are formed over a predetermined area of the first conductive type diffusion layer. Junction areas are formed in the substrate adjacent to both sides of the gates. At least the memory gates are positioned over an area into which the impurities of a second conductive type are implanted, so that the memory transistors may have an inversely doped channel area.

14 Claims, 10 Drawing Sheets

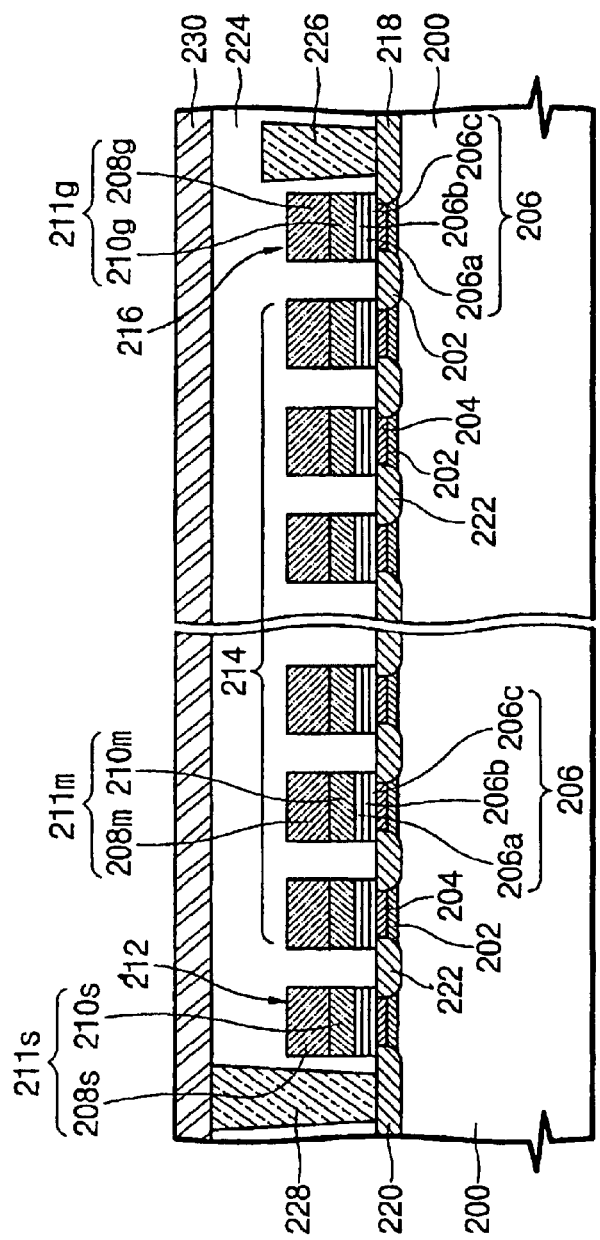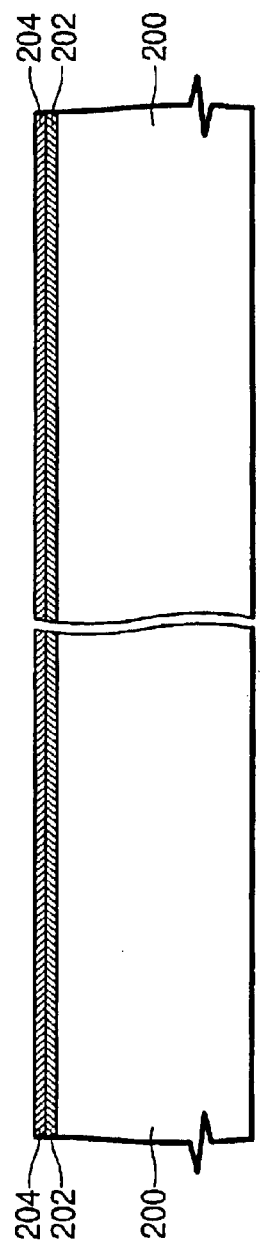

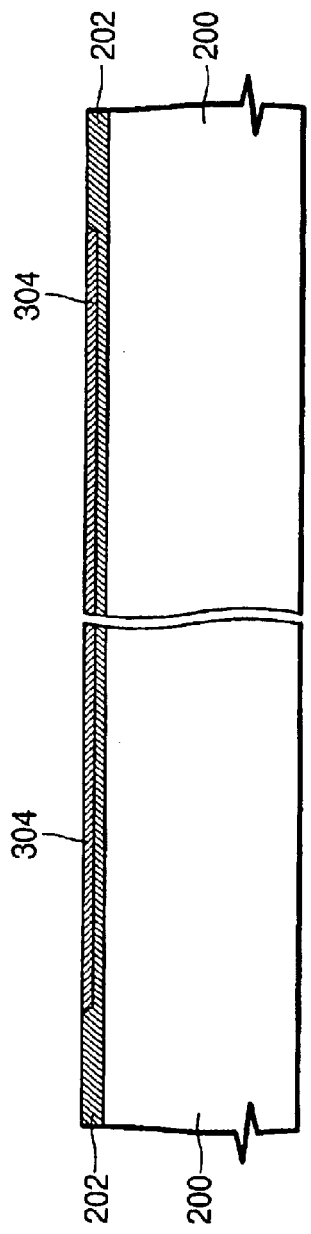
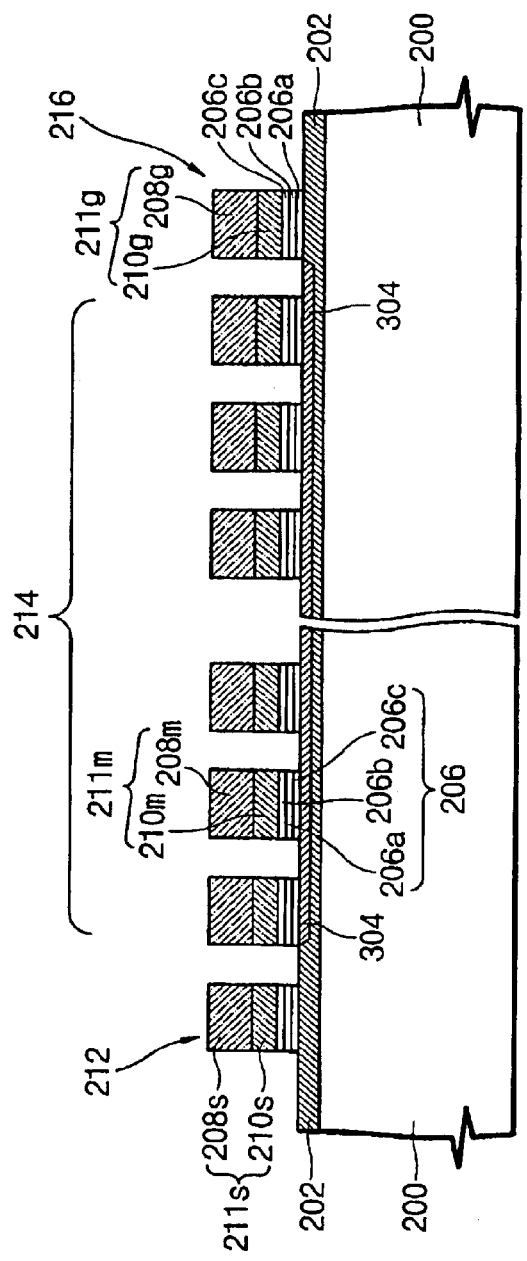

METHOD OF FABRICATING A NON-VOLATILE MEMORY DEVICE WITH A STRING SELECT GATE

CROSS REFERENCE TO RELATED APPLICATIONS

This application is a divisional of U.S. patent Ser. No. 10/330,851, filed on Dec. 26, 2002, now U.S. Pat. No. 6,774,433, which is herein incorporated by reference in its entirety.

BACKGROUND OF THE INVENTION

1. Technical Field of the Invention

The present invention relates to a non-volatile memory device and a method of fabricating the same. More specifically, the present invention is directed to silicon-oxide-nitride-oxide-silicon (SONOS) memory device having a cell transistor for storing information in a stacked gate insulating layer and a method of fabricating the same.

2. Description of the Related Art

Non-volatile memory devices are typically classified as either floating gate type non-volatile memory devices such as a flash memory device or floating trap type non-volatile memory devices such as a SONOS memory device. The flash memory device stores charges (i.e., free carriers) in a floating gate, and the SONOS memory device stores charges in a trap that is spatially isolated in a charge storage layer.

When storing free carriers, a flash memory device may lose all charges stored in a floating gate due to a partial defect of a tunnel oxide layer. Therefore, the flash memory device needs a relatively thick tunnel oxide layer as compared to the SONOS memory device. As a thickness of the tunnel oxide layer is increased to enhance reliability, the memory device needs complex peripheral circuits based on a requirement for a high operating voltage. This requirement prevents a high integration state of devices from being achieved and increases power consumption.

On the other hand, a SONOS memory device may have a relatively thin tunnel oxide layer as compared to the flash memory device because charges are stored in a deep level trap. Therefore, a SONOS memory device is operable at low applied gate voltages of 5–10V.

A conventional NAND-type SONOS memory device constructs a cell array using an enhancement mode transistor whose threshold voltage has a positive value. Since the threshold voltage of the enhancement mode transistor has a positive value, a positive sense voltage must be applied to a gate electrode of the memory transistor when program/erase signals are sensed in a read operation. Accordingly, a circuit for generating the sense voltage is required. In a read operation, a positive sense voltage is applied to a gate of a selected cell and a positive read voltage is applied to gates of unselected cells, so that the NAND-type SONOS memory device turns on the selected cell. Because a threshold voltage of a transistor in a write state is above 5V, the read voltage should be higher than 7V. The unselected transistor in an erase state is soft-programmed by the high read voltage, causing the threshold voltage of the unselected transistor to be high as well.

BRIEF SUMMARY OF THE INVENTION

A purpose of the invention is to provide a NAND-type memory device and a method of fabricating the same.

Another purpose of the invention is to provide a NAND-type memory device having a depletion mode cell transistor and a method of fabricating the same.

Another purpose of the invention is to provide a NAND-type memory device which reduces a peripheral circuit area by eliminating a read voltage generation circuit and a method of fabricating the same.

Another purpose of the invention is to lower the read voltage required to prevent the soft-programming phenomenon caused by a read voltage of a NAND-type SONOS memory device.

In order to achieve these purposes, the invention provides a non-volatile memory device having a multi-layered charge storage layer and a method of fabricating the same. The non-volatile memory device includes a bitline area, a string selection transistor, a plurality of memory transistors, a ground selection transistor, and a source area that are juxtaposed. Each of the memory transistors has a wordline, a multi-layered charge storage layer, and junction areas. The wordline crosses a predetermined area of a substrate of a first conductive type. The multi-layered charge storage layer is interposed between the wordline and the substrate. The junction areas are formed in the substrate, adjacent to opposite sides of the wordline, and are of a second conductive type. The memory transistors are depletion mode transistors with negative threshold voltages. There is a channel diffusion layer and an anti-punchthrough diffusion layer. The channel diffusion layer is formed at a surface of the substrate between the junction areas of the memory transistor, and the anti-punchthrough diffusion layer is formed between the junction areas below the channel diffusion layer. The channel diffusion layer and the anti-punchthrough diffusion layer are of the first conductive type. However, the concentration of the anti-punchthrough diffusion layer is higher than that of the substrate, and the concentration of the channel diffusion layer is lower than that of the substrate.

Similar to the memory transistors, the string selection transistor and the ground selection transistor are depletion mode transistors or enhancement mode transistors.

A method of erasing the non-volatile memory device includes the step of forming a diffusion layer of the first conductive type in a predetermined area of the first conductive type substrate. Impurities of the second conductive type are implanted into a predetermined area of the substrate where the first conductive type diffusion layer is formed, forming an inversely doped area at a surface of the first conductive type diffusion layer. A string selection gate, a plurality of wordlines, and a ground selection gate are formed to cross over a predetermined area of the first conductive type diffusion layer. Alternatively, the string selection gate and the ground selection gate may cross over the inversely doped area or cross over the first conductive type diffusion layer.

BRIEF DESCRIPTION OF THE DRAWINGS

FIG. 2 is a cross-sectional view, taken along a line I–I' of FIG. 1, for explaining a non-volatile memory device according to a first embodiment of the present invention.

FIG. 3 through FIG. 5 are flow diagrams for explaining a method of fabricating the non-volatile memory device shown in FIG. 2.

FIG. 7 through FIG. 9 are flow diagrams for explaining a method of fabricating the non-volatile memory device shown in FIG. 6.

DETAILED DESCRIPTION OF THE INVENTION

Figure 1:
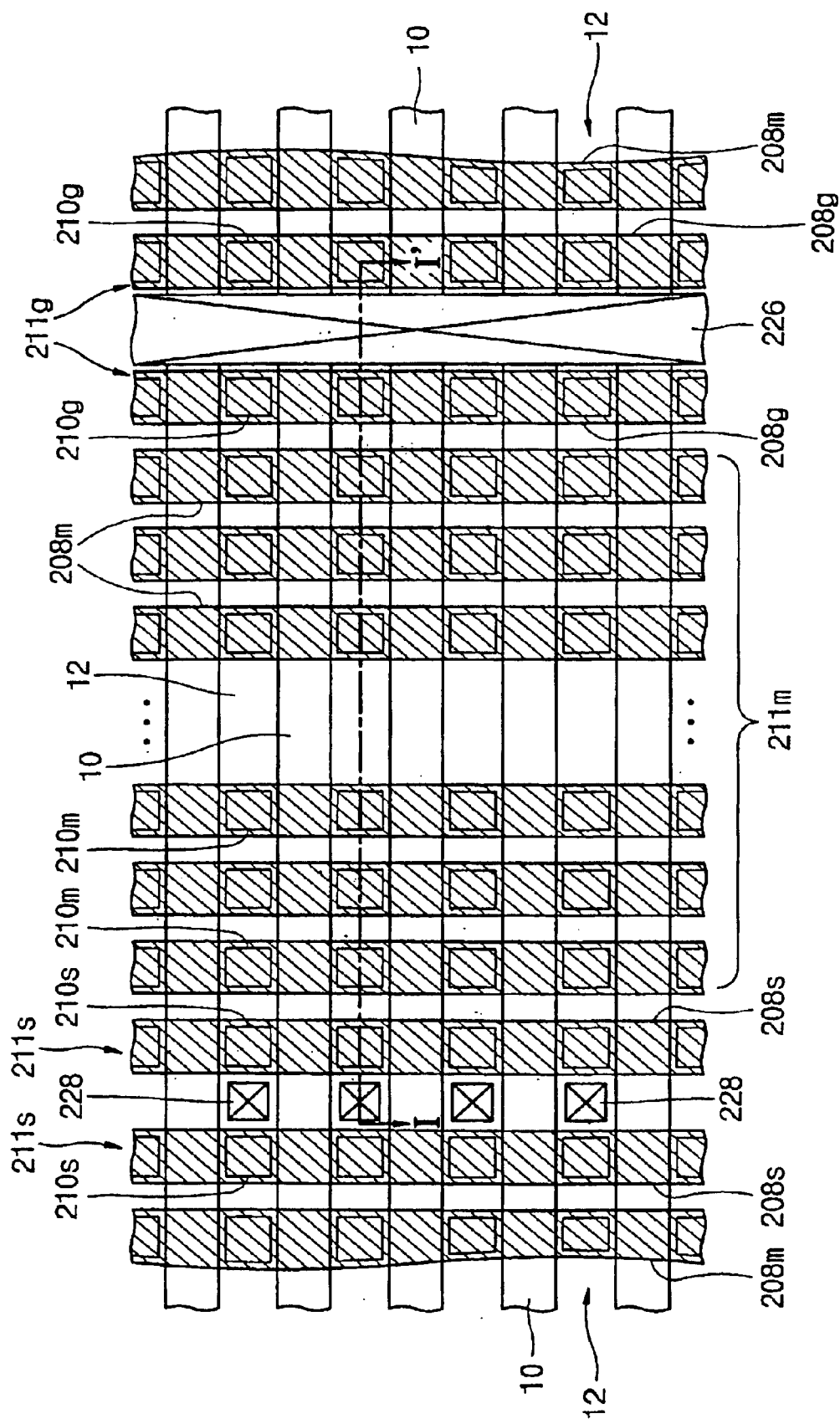
FIG. 1 is a top plan view of a NAND-type cell array according to the preferred embodiment of the present invention.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

A top plan view of a NAND-type cell array according to the preferred embodiment of the present invention is illustrated in FIG. 1.

Referring to FIG. 1, a device isolation layer 10 is formed at a predetermined region of a first conductive type, i.e., a P-type substrate, to define a plurality of active regions 12. A string selection gate electrode 211s, a plurality of memory gate electrodes 211m, and a ground selection gate electrode 211g are juxtaposed to cross over the active regions 12. A multi-layered charge storage layer (206 of FIG. 2) is interposed between the memory gate electrodes 211m and the active regions 12. A multi-layered charge storage layer or a single-layered gate insulating layer may be interposed between the string selection gate electrode 211s and the ground selection gate electrodes 211g. There is a junction area (not shown) in active regions 12 adjacent to opposite sides of selection gate electrodes 211s and 208g and the memory gate electrodes 211m. Junction areas adjacent to the string selection gate electrode 211s correspond to bitline areas to which a bitline is connected. Junction areas of the ground selection gate electrode 211g correspond to source areas.

A bitline contact plug 228 is coupled to each of the bitline areas, and a common source line 226 is coupled to the source areas. The common source line 226 crosses the device isolation layers 10 to be commonly coupled to the source areas.

The multi-layered charge storage layer (206 of FIG. 2) can be interposed only between the memory gate electrodes 211m and the active regions 12. Alternatively, the multi-layered charge storage layer may cover an entire surface over the active region 12 or an entire surface over the active region 12 and the device isolation layer 10. The data of a memory transistor is stored in the charge storage layer located at intersections of the memory gate electrodes 211m and the active regions 12.

The gate electrodes 211g, 211m, and 211s may include upper gate electrodes 208g, 208m, and 208s crossing the active region and lower gate electrodes 210g, 210m, and 210s interposed between the active regions 12 and the upper gate electrodes.

Although not shown in the figure, a channel diffusion layer and an anti-punchthrough diffusion layer are located, at least, at the active region 12 below the memory gate electrodes 211m. The anti-punchthrough diffusion layer has a higher concentration than the substrate and is of the same conductive type as the substrate. The channel diffusion layer has a lower concentration than the substrate and is of the same conductive type or is of a different conductive type than that of the substrate. Thus, the memory transistors are depletion mode transistors.

FIG. 2 is a cross-sectional view, taken along a line I–I' of FIG. 1, that illustrates a non-volatile memory device according to a first embodiment of the invention.

Referring to FIG. 2, a non-volatile memory device according to the present invention includes a bitline area 220, a string selection gate 212, a plurality of wordlines 214, a ground selection gate 216, and a source area 218 that are serially arranged. There are junction areas 222 at surfaces of active regions (12 of FIG. 1) adjacent to one side of the gates 212, 216 and adjacent to both sides of the wordlines 214.

Similar to a conventional NAND-type memory cell, an interlayer insulating layer 224 covers an entire surface of a semiconductor substrate 200. A common source line 226 is coupled to the source area 218, and a bitline contact plug 228 is coupled to the bitline area 220. Thus, the bitline 230 and the bitline area 220 are electrically connected to each other.

The string selection gate 212 includes a string selection gate electrode 211s comprising an upper string selection gate electrode 208s and lower string selection gate electrodes 210s over the active region (12 of FIG. 1), and a multi-layered charge storage layer 206 interposed between the lower string selection gate electrodes 210s and the active region 12. Each of the wordlines 214 includes a memory gate electrode 211m comprising an upper memory gate electrode 208m and lower memory gate electrodes 210m over the active region (12 of FIG. 1), and a multi-layered charge storage layer 206 interposed between the lower memory gate electrodes 210m and the active region 12. The ground selection gate 216 includes a ground selection gate electrode 211g comprising an upper ground selection gate electrode 208g and lower ground selection gate electrodes 210g over the active region (12 of FIG. 1) and a multi-layered charge storage layer 206 interposed between the lower ground selection gate electrode 210g and the active region 12. The multi-layered charge storage layers 206 may be interconnected to be disposed on the active region 12 between the gates 212 and 216 and the wordlines 214. However, the data of a memory transistor is stored in the multi-layered charge storage layer 206 at the intersection of the lower memory gate electrode 210m and the active region 12. The multi-layered charge storage layer 206 may be comprised of a tunnel insulating layer 206a, a trap insulating layer 206b, and a blocking insulating layer, which are sequentially stacked.

The string selection gate 212, a junction area 222 adjacent to the string selection gate 212, and a bitline area 220 constitute a string selection transistor. A wordline 214 and a junction area 222 adjacent to a side of the wordline 214 constitute a memory transistor. The ground selection gate 216, a junction area 222 adjacent to the ground selection gate 216, and a source region 218 constitute a ground selection transistor.

In a first embodiment of the invention, the string selection transistor, the memory transistor, and the ground selection transistor are depletion mode transistors. In this regard, channel diffusion layers 204 are formed on the surface of the active regions 12 below the string selection gate 212, the wordlines 214, and the ground selection gate 216. Anti-punchthrough diffusion layers 202 are formed below their respective channel diffusion layers 204. The channel diffusion layer 204 and the anti-punchthrough diffusion layer 202 are interposed between the junction areas 222. The anti-punchthrough diffusion layer 202 is of the same conductive type as the substrate, and is more heavily doped than the substrate. On the other hand, the channel diffusion layer 204 has a lower concentration than the substrate and is either of the same conductive type as the substrate or is an inversely doped area (i.e., has a different conductive type from that of the substrate).

A method of fabricating the non-volatile memory device shown in FIG. 2 will now be described with reference to FIGS. 3–5.

Referring to FIG. 3, P-type impurities are implanted into a predetermined region of a P-type substrate 200 to form a P-type impurity diffusion layer 202. N-type impurities are more shallowly implanted into a surface of an active region 12 than the P-type impurity diffusion layer 202 to form an inversely doped region 204 at the surface of the active region 12. Preferably, N-type impurities are implanted so that a conductive type of the inversely doped region 204 can be N-type or of a more lightly doped P-type than the substrate 200. For example, the P-type impurity diffusion layer 202 is preferably formed by implanting $BF_2$ ions at a dose of $4 \times 10^{12}$ ion/$cm^2$ and with 50 keV. The inversely doped region 204 is preferably formed by implanting As ions at a dose of $8 \times 10^{12}$ ion/$cm^2$ and with 40 keV.

Figure 4:
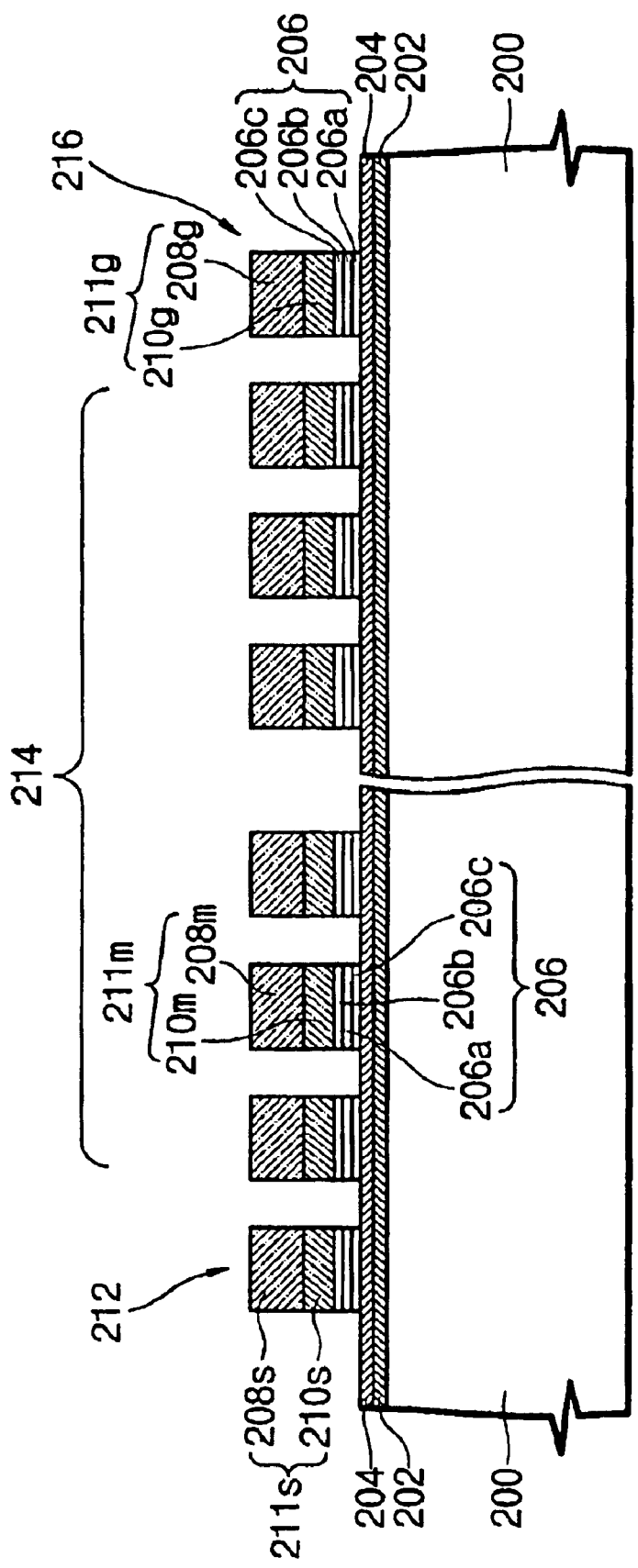

Referring to FIG. 4, a string selection gate 212, a plurality of wordlines 214, and a ground selection gate 216 are positioned over the inversely doped region 204. The string selection gate 212 includes a string selection gate electrode 211s over the inversely doped region 204 and a multi-layered charge storage layer 206 interposed between the string selection gate electrode 211s and the inversely doped region 204. Each of the wordlines 214 includes a memory gate electrode 211m over the inversely doped region 204 and a multi-layered charge storage layer 206 between the memory gate electrode 211m and the inversely doped region 204. The ground selection gate 216 includes a ground selection gate electrode 211g over the inversely doped region 204 and a multi-layered charge storage layer 206 interposed between the ground selection gate electrode 211g and the inversely doped region 204. The multi-layered charge storage layer 206 is a multi-layered insulating layer having at least one insulating layer with a large trap density. Preferably, the multi-layered charge storage layer 206 is made of a tunnel insulating layer 206a, a trap insulating layer 206b, and a block insulating layer 206c, which are sequentially stacked.

In order to form the string selection gate 212, the wordlines 214, and the ground selection gate 216, a device isolation layer (10 of FIG. 1) is formed to define an active region (12 of FIG. 1) and a stack pattern is formed in which a multi-layered insulating layer and a lower conductive layer are sequentially stacked between the device isolation layers.

An upper conductive layer is formed to cover an entire surface of the device isolation layer and the stack pattern. The upper conductive layer, the lower conductive layer, and the multi-layered insulating layer are sequentially patterned to form a string selection gate electrode 211s, a plurality of memory gate electrodes 211m, and the ground selection gate electrode 211g. Each of the gate electrodes 211s, 211m, and 211g has an upper gate electrode 208s, 208m, 208g over the active regions (12 of FIG. 1) and lower gate electrodes 210s, 210m, and 210g interposed between the respective upper gate electrodes 208s, 208m, 208g, and the active region. A charge storage layer 206 is formed at intersections of the gates 211s, 211m, and 211g and the active region. Alternatively, the upper and lower conductive layers are also patterned to cover a lower part of the gate electrode 208s, 208m, and 208g as well as an entire surface of the inversely doped region 204.

When a multi-layered insulating layer and a lower conductive layer are sequentially formed on a semiconductor substrate 200 and the lower conductive layer, the multi-layered insulating layer, and the substrate are sequentially patterned to form a plurality of trenches defining an active region, the stack pattern may be concurrently formed. Areas between the stack patterns may be filled with an insulating layer to form device isolation layers.

Figure 5:
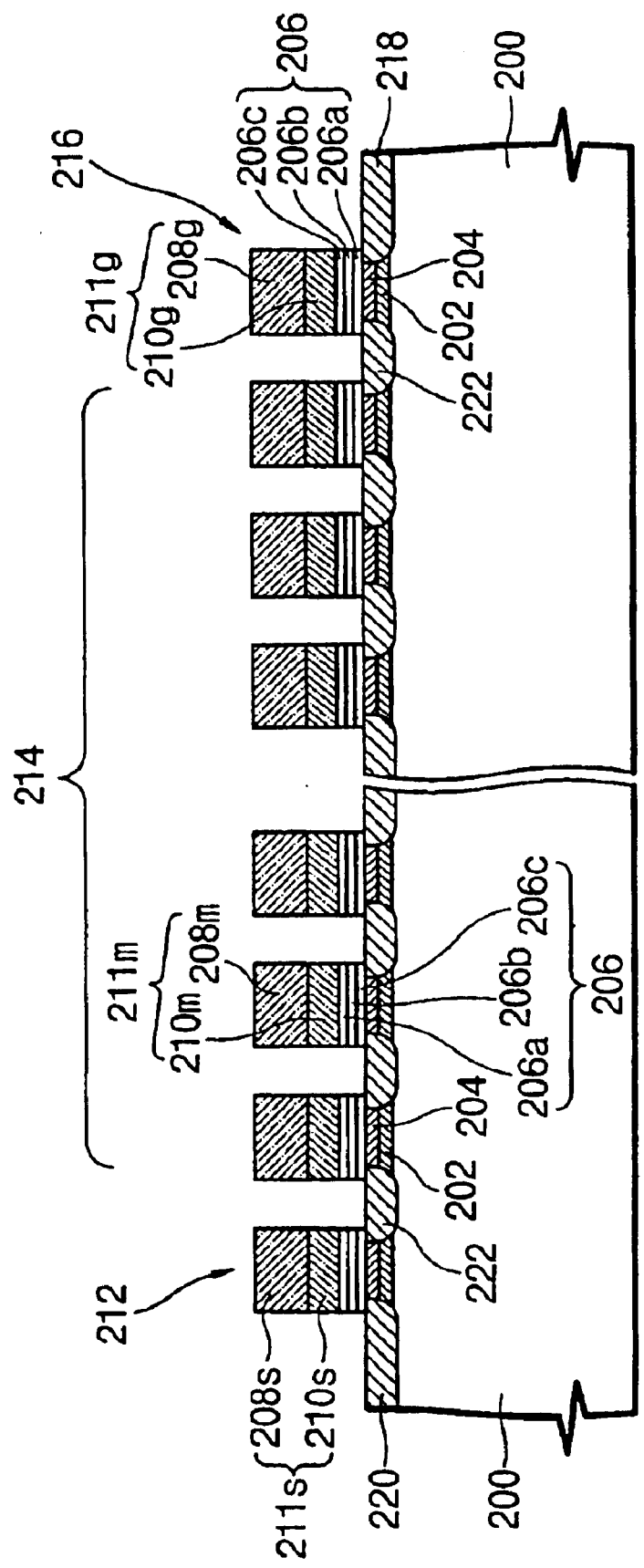

In FIG. 5, using the gates 212 and 216 and the wordlines 214 as an ion-implanting mask, impurities are implanted into the active region to form junction areas 222, a bitline area 220, and a source area 218 at a surface of an active region (12 of FIG. 1). The junction areas 222 are adjacent to the wordline 214. The bitline area 220 is adjacent to the string selection gate 212, and the source area 218 is adjacent to the ground selection gate 216. The junction area 222 may have a different doping concentration from that of the bitline area 220 and the source area 218. Under the string selection gate 212, the wordline 214, and the ground selection gate 216, the inversely doped area 204 and the P-type impurity diffusion layer 202 correspond to a channel diffusion layer and an anti-punchthrough diffusion layer, respectively. Using a conventional manner of forming a NAND-type cell array, a common source line 226 (FIG. 2) coupled to the source region 218, a bitline plug 228 (FIG. 2) coupled to the bitline area 220, and a bitline 230 (FIG. 2) coupled to the bitline plug 228 (FIG. 2) may be formed.

In conclusion, because the channel diffusion layer (inversely doped area 204) is inversely doped with N-type impurities, the string selection transistor, the memory transistors, and the ground transistor may all have negative threshold voltages.

On the other hand, prior to operation of the non-volatile memory device according to the first embodiment, a high electric field is applied between the gate electrodes of the ground selection transistor and the string selection transistor and the active region. By doing so, negative charges may accumulate in the multi-layered charge storage layer of the ground selection transistor and the multi-layered charge storage layer of the string selection transistor. Thus, the string selection transistor and the ground selection transistor may have positive threshold voltages.

Figure 6:
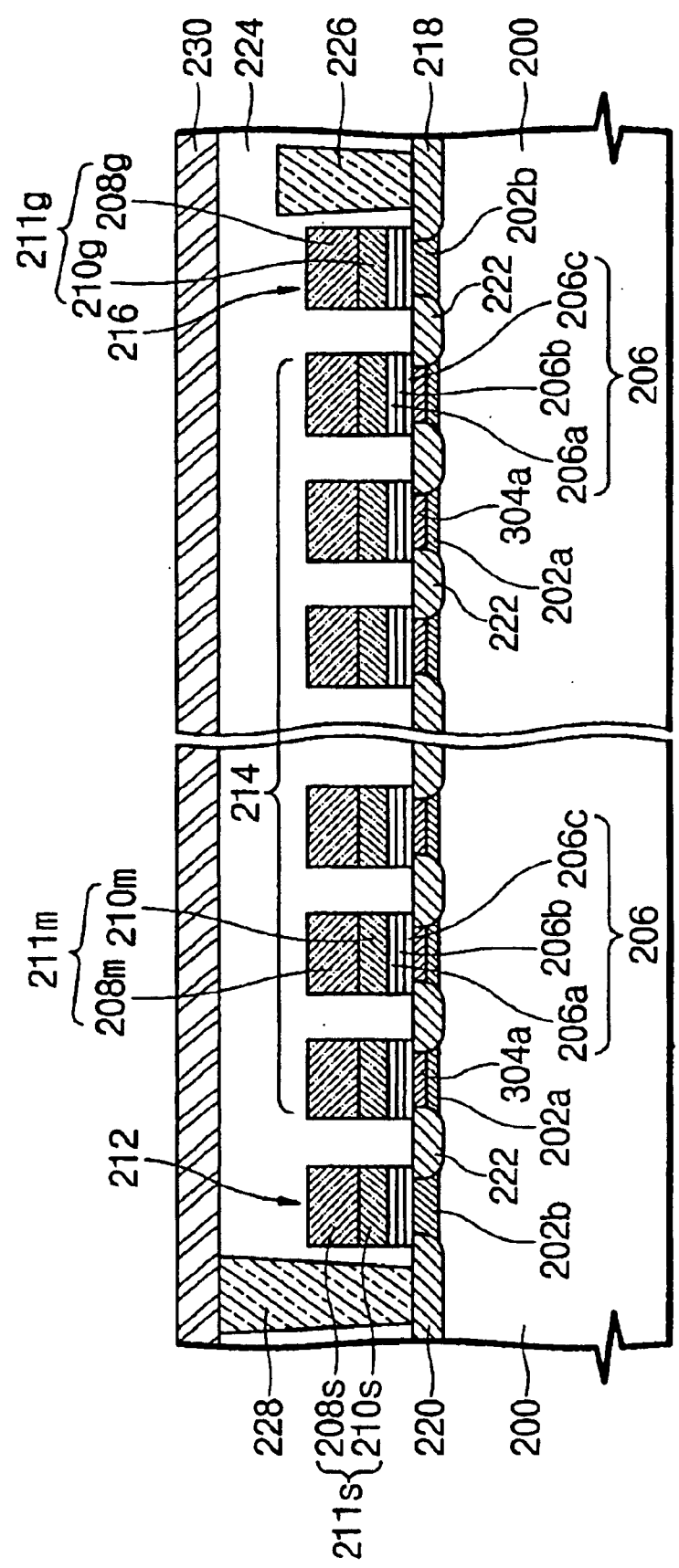
FIG. 6 is a cross-sectional view, taken along line I–I' of FIG. 1, for explaining a non-volatile memory device according to a second embodiment of the present invention.

FIG. 6 is a cross-sectional view, taken along a line I–I' of FIG. 1, that illustrates a non-volatile memory device according to a second embodiment of the invention.

Referring to FIG. 6, a bitline area 220, a string selection gate 212, a plurality of wordlines 214, a ground selection gate 216, and a source region 218 are serially disposed, which is similar to the first embodiment (FIG. 2). There are junction areas 222 at surfaces of active regions (12 of FIG. 1) that are adjacent to a side of the gates 212 and 216 and to both sides of the wordlines 214.

Similar to the first embodiment, an interlayer insulating layer 224 covers an entire surface of a semiconductor substrate 200. A common source line 226 is coupled to the source area 218. A bitline contact plug 228 is coupled to a bitline area 220, electrically connecting the bitline 230 to the bitline area 220.

The string selection gate 212 includes a string selection gate electrode 211s crossing the active region 12 and a multi-layered charge storage layer 206 interposed between the string selection gate electrode 211s and the active region 12. Each of the wordlines includes a memory gate electrode 211m and a multi-layered charge storage layer 206 interposed between the memory gate electrode 211m and the active region 12. The ground selection gate 216 includes a ground selection gate electrode 211g crossing the active region and a multi-layered charge storage layer 206 interposed between the ground selection gate electrode 211g and the active region 12. The charge storage layers 206 may be formed on the active region 12 between the gates 212 and 216 and the wordlines 214. However, memory cell data is stored in the multi-layered charge storage layer 206 at the intersection of the memory gate electrode 211m and the active region 12. The multi-layered charge storage layer 206 may be made of a tunnel insulating layer 206a, a trap insulating layer 206b, and a blocking insulating layer 206c, which are sequentially stacked. The structures of the string selection gate electrode 211s, the memory gate electrode 211m, and the ground selection gate electrode 211g are dual structures composed of an upper electrode and a lower electrode, similar to the first embodiment.

The string selection gate 212, the junction area 222 adjacent to one side of the string selection gate 212, and the bitline area 220 constitute a string selection transistor. A wordline 214 and the junction area 222 adjacent to both sides of the wordline 214 constitute a memory transistor. The ground selection gate 216 and the junction area 222 adjacent to one side of the ground selection gate 216 constitute a ground selection transistor.

In the second embodiment, the memory transistor is a depletion mode transistor, while the string selection transistor and the ground selection transistor are enhancement mode transistors. As illustrated in FIG. 6, channel diffusion layers 304a are disposed at a surface of the active region 12 under their respective wordlines 214. The anti-punchthrough diffusion layers 202a and the single-layered channel diffusion layer 202b below the selection gates 212 and 216 are of the same conductive type as the substrate and are more heavily doped than the substrate. However, the channel diffusion layers 304a below the wordlines 214 are either of the same conductive type as the substrate and be more lightly doped than the substrate or are of a different conductive type than that of the substrate.

A method of fabricating the non-volatile memory device shown in FIG. 6 will now be described with reference to FIGS. 7–9.

Referring to FIG. 7, impurities are implanted into a predetermined area of a P-type substrate 200 to form a P-type impurity diffusion layer 202. N-type impurities are more shallowly implanted than the P-type impurity diffusion layer 202 into a predetermined area of an active region where the P-type impurity diffusion layer 202 is formed, thereby forming an inversely doped area 304 at a surface of the active region 12. As illustrated in FIG. 6, the inversely doped area 304 is formed at the surface of an area where memory transistors will be formed, but is not formed at the surface of an area where a string selection transistor and a ground selection transistor will be formed (i.e., the P-type impurity diffusion layer 202 remains). Preferably, the inversely doped area 304 is either of a N-type or of a P-type that is more lightly doped with P-type impurities than the substrate. For example, the P-type impurity diffusion layer 202 is preferably formed by implanting $BF_2$ ions at a dose of $4\times10^{12}$ ion/cm$^2$ and with 50 keV. The inversely doped region 204 is preferably formed by implanting As ions at a dose of $8\times10^{12}$ ion/cm$^2$ and with 40 keV. A device isolation layer (10 of FIG. 1) is formed at a predetermined area of the P-type semiconductor substrate 200 to define an active region (12 of FIG. 1).

Referring to FIG. 8, a string selection gate 212 and a ground selection gate 216 are formed over an area where the P-type impurity diffusion layer 202 is formed. At the same time, a plurality of wordlines 214 are formed between the string selection gate 212 and the ground selection gate 216. The wordlines 214 are formed over the inversely doped area 304. The string selection gate 212 includes a string selection gate electrode 211s over the P-type impurity diffusion layer 202 and a multi-layered charge storage layer 206 interposed between the string selection gate electrode 211s and the P-type impurity diffusion layer 202. Each of the wordlines 214 include a memory gate electrode 211m over the inversely doped area 304 and a multi-layered charge storage layer 206 between the memory gate electrode 211m and the inversely doped area 304. The ground selection gate 216 includes a ground selection gate electrode 211g over the P-type impurity diffusion layer 202 and a multi-layered charge storage layer 206 interposed between the ground selection gate electrode 211g and the P-type impurity diffusion layer 202. The multi-layered charge storage layer 206 is a multi-layered insulating layer having at least one insulating layer with a high trap density. Preferably, the multi-layered charge storage layer 206 is made of a tunnel insulating layer 206a, a trap insulating layer 206b, and a block insulating layer 206c, which are sequentially stacked.

The string selection gate 212, the wordline 214, and the ground selection gate 216 may be formed in the same manner as the first embodiment.

Figure 9:
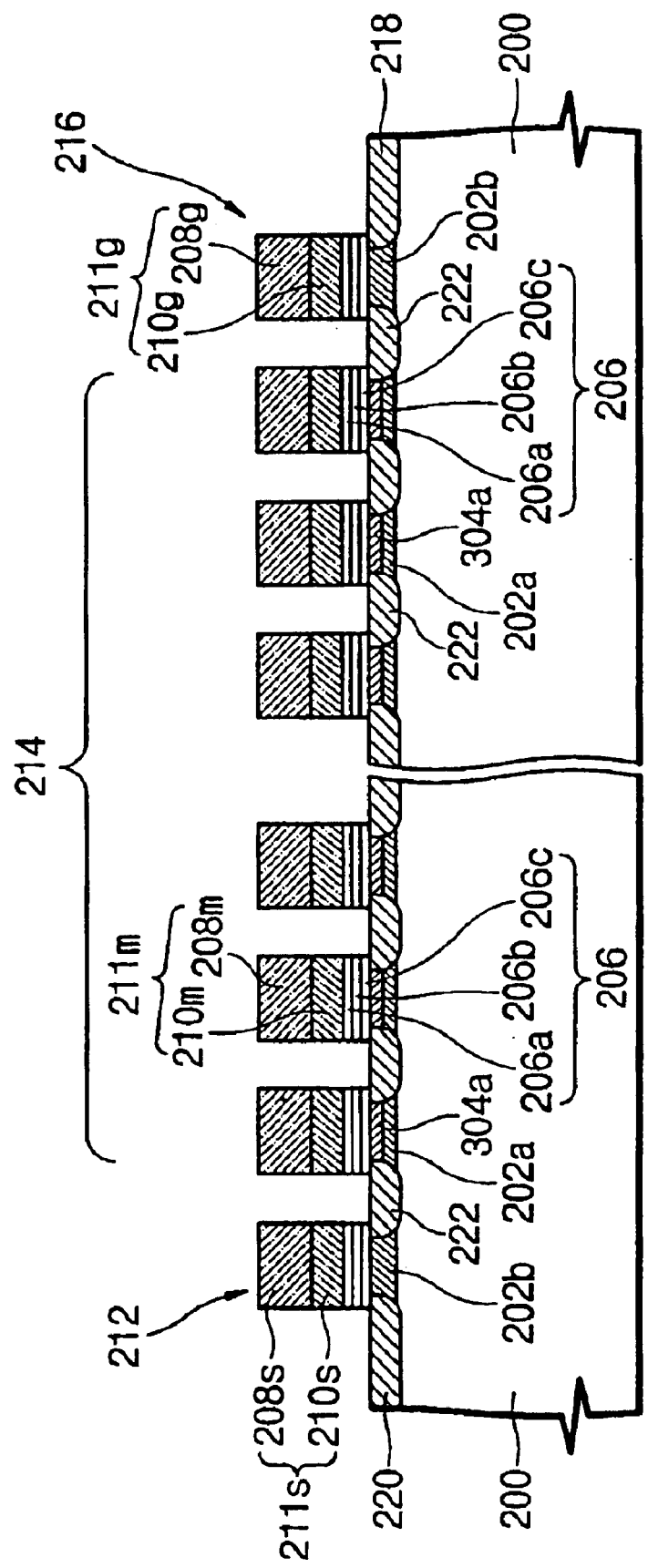

Referring to FIG. 9, using the gates 212, 216 and the wordlines 214 as an ion-implanting mask, impurities are implanted into the active region to form junction areas 222 at a surface of the active region. A bitline area 220 and a source area 218 are formed at a surface of the active region adjacent to the string selection gate 212 and the ground selection gate 216, respectively. A doping concentration of the junction area 222 may be different from that of the bitline area 220 and the source area 218. The P-type impurity diffusion layer (202 of FIG. 8) below the string selection gate 212 and the P-type impurity diffusion layer (202 of FIG. 8) below the ground selection gate 216 correspond to a channel diffusion layer 202b of the string selection transistor and a channel diffusion layer 202b of the ground selection transistor, respectively. The inversely doped area (304 of FIG. 8) below the wordlines 214 and the P-type impurity diffusion layer (202 of FIG. 8) below the wordlines 214 correspond to a channel diffusion layer 304a and an anti-punchthrough diffusion layer 202a of the memory transistor, respectively. Using a conventional manner of forming a NAND-type cell array, a common source line 226 (FIG. 6) coupled to the source area 218, a bitline plug 228 (FIG. 6) coupled to the bitline area 220, and a bitline 230 (FIG. 6) coupled to the bitline plug 228 (FIG. 6) are formed.

In conclusion, because the channel diffusion layers 304a are inversely doped with N-type impurities (similar to the first embodiment), the memory transistors may have negative threshold voltages. Unlike the first embodiment, because the string selection transistor and the ground selection transistor have positive threshold voltages, they are turned on when a positive voltage is applied to a gate.

Figure 10:
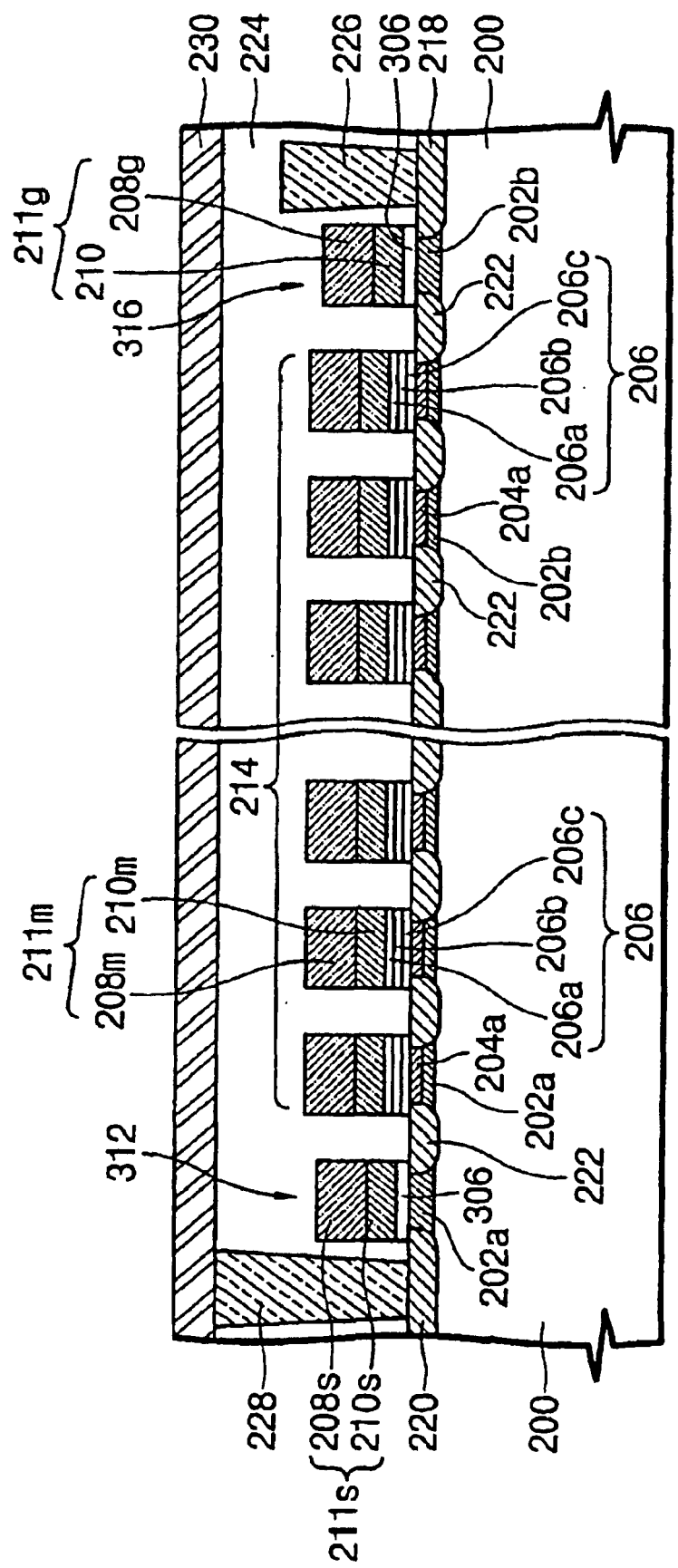
FIG. 10 is a cross-sectional view, taken along a line I–I' of FIG. 1, for explaining a non-volatile memory device according to a third embodiment of the present invention.

FIG. 10 is a cross-sectional view, taken along a line I–I' of FIG. 1, illustrating a non-volatile memory device according to a third embodiment of the invention.

Referring to FIG. 10, a bitline area 220, a string selection gate 312, a plurality of wordlines 214, a ground selection gate 316, and a source area 218 are serially disposed. There are junction areas 222 at a surface of active regions adjacent to one side of the gates 312, 316, and adjacent to both sides of the gates 314.

Similar to the second embodiment, an interlayer insulating layer 224 covers an entire surface of a semiconductor substrate 200. A common source line 226 is coupled to a source area 218 and a bitline contact plug 228 is coupled to a bitline area 220, electrically connecting the bitline 230 to the bitline area 220.

Each of the wordlines 214 include a memory gate electrode 211m over the active region (12 of FIG. 1) and a multi-layered charge storage layer 206 interposed between the memory gate electrode 211m and the active region (12 of FIG. 1). The charge storage layer 206 may also be formed on the active region (12 of FIG. 1) in an area between gates 312, 316 and the wordlines 214. However, the data of a memory transistor is stored in the multi-layered charge storage layer 206 at an intersection of the memory gate electrode 211m and the active region 12. The multi-layered charge storage layer 206 may be made of a tunnel insulating layer 206a, a trap insulating layer 206b, and a blocking insulating layer, which are sequentially stacked. The string selection gate electrode 211s, the memory gate electrode 211m, and the ground selection gate electrode 211g are dual structures composed of an upper electrode and a lower electrode, similar to the first and second embodiments.

Unlike the second embodiment, the string selection gate 312 includes a string selection gate electrode 211s over the active region (12 of FIG. 1) and a gate insulating layer 306 interposed between the string selection gate electrode 211s and the active region (12 of FIG. 1). The ground selection gate 316 includes a ground selection gate electrode 211g over the active region and a gate insulating layer 306 interposed between the ground selection gate electrode 211g and the active region (12 of FIG. 1).

The string selection gate 312, the junction area 222 adjacent to one side of the string selection gate 312, and the bitline area 220 constitute a string selection transistor. A wordline 214 and the junction areas 222 adjacent to both sides of the wordline 214 constitute a memory transistor. The ground selection gate 216, the junction area adjacent to one side of the ground selection gate 216, and the source area 218 constitute a ground selection transistor.

In the third embodiment, the memory transistors are depletion mode transistors, and the string selection transistor and the ground selection transistor are enhancement mode transistors. As shown in FIG. 10, channel diffusion layers 204a are disposed at a surface of the active region 12 under the respective wordlines 214. An anti-punchthrough diffusion layer 202b is disposed below the respective channel diffusion layers 204a. However, a single-layered channel diffusion layer 202a is disposed below the string selection gate 312 and the ground selection gate 316. The anti-punchthrough diffusion layer 202b and the single-layered channel diffusion layer 202a below the selection gates 312, 316 are more heavily doped than the substrate and are of the same conductive type as the substrate. However, the channel diffusion layers 204a below the wordlines 214 are more lightly doped than the substrate and have either the same conductive type as the substrate or have a different conductive type from that of the substrate.

A method of fabricating the non-volatile memory device shown in FIG. 10 will now be described with reference to FIGS. 11–13.

Figure 11:
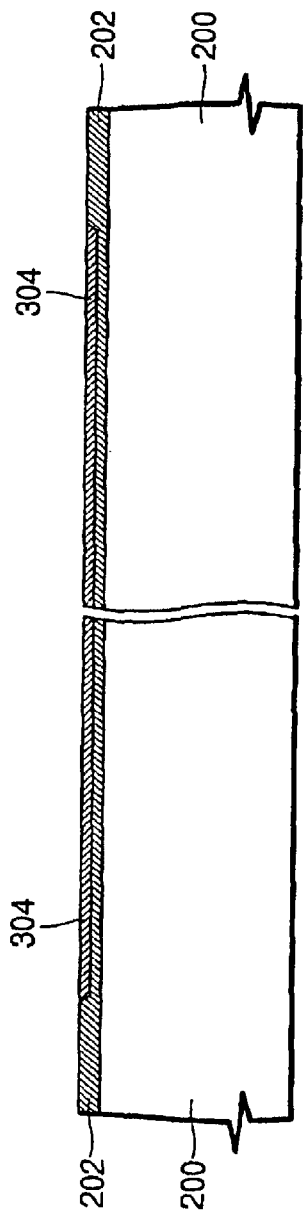
FIG. 11 through FIG. 13 are flow diagrams for explaining a method of fabricating the non-volatile memory device shown in FIG. 10.

Referring to FIG. 11, impurities are implanted into a predetermined area of a P-type substrate 200 to form a P-type impurity diffusion layer 202. N-type impurities are more shallowly implanted than the P-type impurity diffusion layer 202 into a predetermined area of an active region where the P-type impurity diffusion layer 202 is formed, thereby forming an inversely doped area 304 at a surface of the active region 12. Similar to the second embodiment, the inversely doped area 304 is formed at the surface of an area where memory transistors will be formed, but is not formed at the surface of an area where a string selection transistor and a ground selection transistor will be formed (i.e., the P-type impurity diffusion layer 202 remains). Preferably, the inversely doped area 304 is either of a N-type or of a P-type that is more lightly doped with P-type impurities than the substrate 200. For example, the P-type impurity diffusion layer 202 is preferably formed by implanting $BF_2$ ions at a dose of $4 \times 10^{12}$ ion/cm$^2$ and with 50 keV. The inversely doped region 304 is preferably formed by implanting As ions at a dose of $8 \times 10^{12}$ ion/cm$^2$ and with 40 keV.

Figure 12:
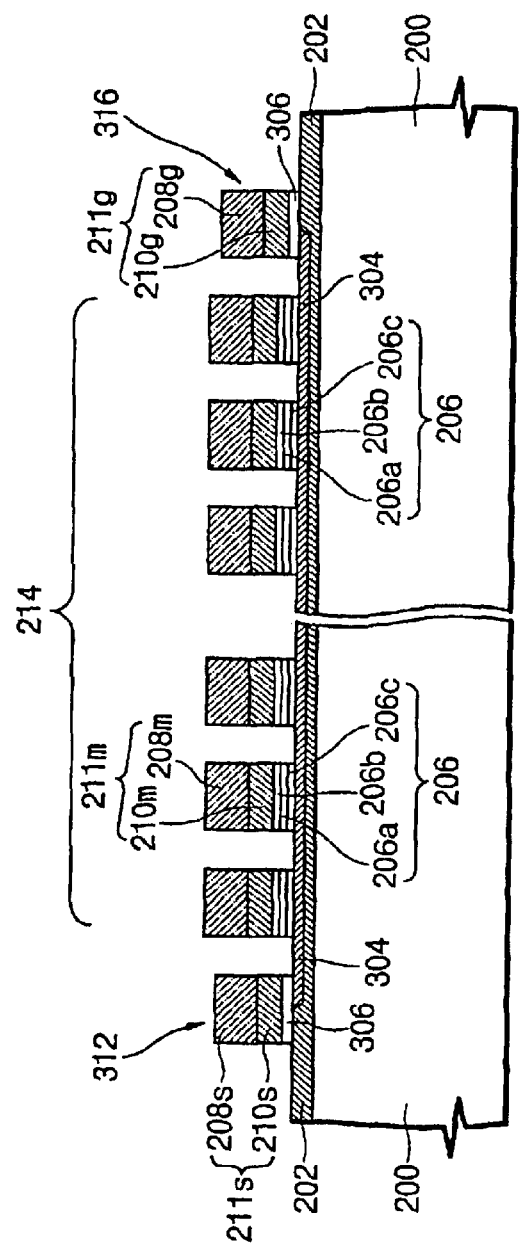

Referring to FIG. 12, a string selection gate 312 and a ground selection gate 316 are formed over an area where the P-type impurity diffusion layer 202 is formed. At the same time, a plurality of wordlines 214 are formed between the string selection gate 312 and the ground selection gate 316. The wordlines 214 are formed over the inversely doped area 304. The string selection gate 212 includes a string selection gate electrode 211 s over the P-type impurity diffusion layer 202 and a gate insulating layer 306 interposed between the string selection gate electrode 211 s and the P-type impurity diffusion layer 202. Each of the wordlines 214 includes a memory gate electrode 211m over the inversely doped area 304 and a multi-layered charge storage layer 206 between the memory gate electrode 211m and the inversely doped area 304. The ground selection gate 216 includes a ground selection gate electrode 211g over the P-type impurity diffusion layer 202 and a gate insulating layer 306 interposed between the ground selection gate electrode 211g and the P-type impurity diffusion layer 202. The multi-layered charge storage layers 206 are multi-layered insulating layers with at least one insulating layer with a high trap density. Preferably, the multi-layered charge storage layers 206 are made of a tunnel insulating layer 206a, a trap insulating layer 206b, and a block insulating layer 206c, which are sequentially stacked.

The steps of forming the string selection gate 312, the wordlines 214, and the ground selection gate 316 are now explained in detail. A multi-layered insulating layer 206 is formed at an entire surface of the inversely doped area 304. A gate insulating layer 306 is formed at an area where the P-type impurity diffusion layer is disposed. A lower conductive layer is formed over an entire surface of a resultant structure where the multi-layered insulating layer 206 and the gate insulating layer 306 are formed. The lower conductive layer, the multi-layered insulating layer, the gate insulating layer, and the substrate are sequentially patterned to form a plurality of trenches defining active regions (12 of FIG. 1). At the same time, stack patterns are formed on the active regions. Each of the stack patterns is made of an insulating layer and a lower conductive layer. Areas between the trench and the stack patterns are filled with insulating layers to form device isolation layers (10 of FIG. 1). An upper conductive layer is formed is formed to cover the stack patterns and the device isolation layers. The upper conductive layer, the lower conductive layer, and the insulating layers are sequentially patterned to form the wordlines 214, the string selection transistor 312, and the ground selection transistor 316. The multi-layered charge storage layer 206 may cover lower parts of the wordlines 214 as well as an entire surface of the inversely doped area 304.

Figure 13:
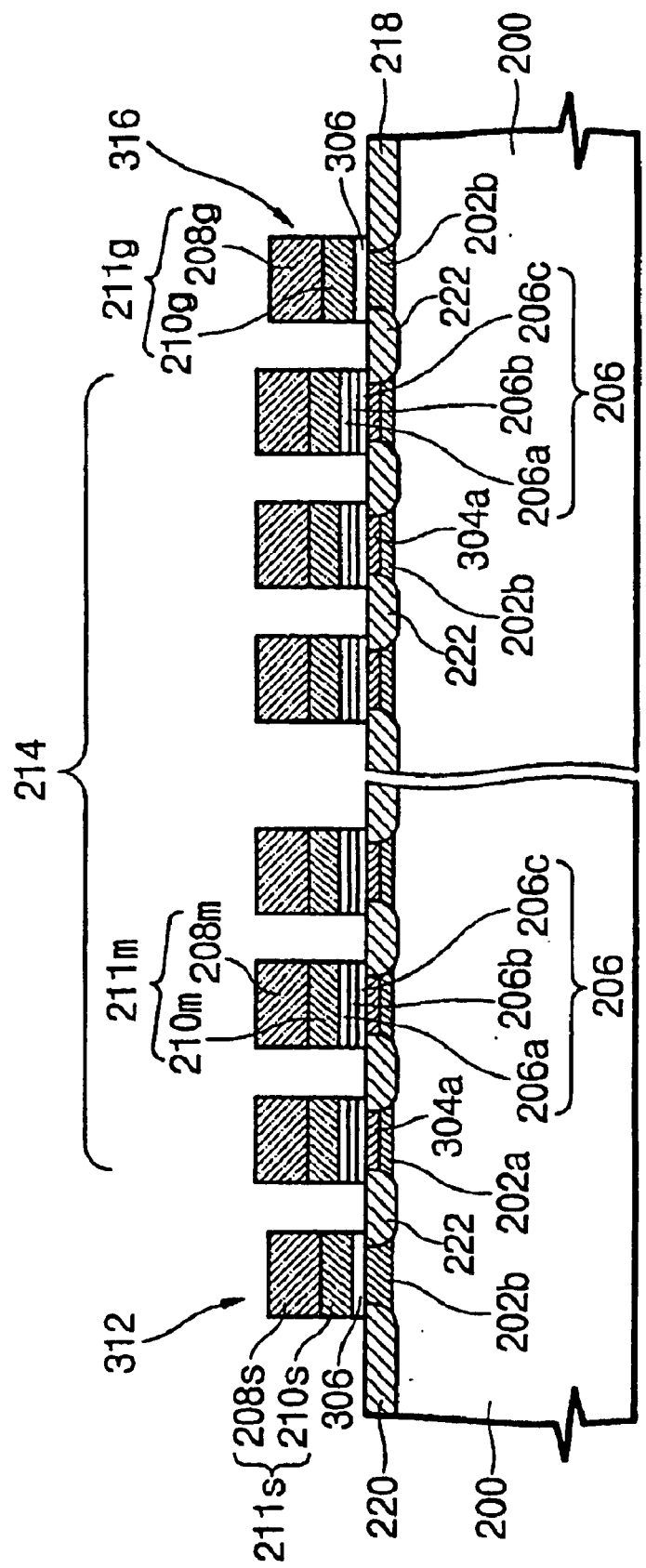

Referring to FIG. 13, using the gates 312, 214, and 316 as an ion-implanting mask, impurities are implanted into the active region to form junction areas 222 at surfaces of active regions adjacent to the wordlines 214. A bitline area 220 and a source area 218 are simultaneously formed at surfaces of active regions adjacent to the string selection transistor 312 and the ground selection transistor 316, respectively. The doping concentration of the junction area 222 may be different from the concentrations of the bitline area 220 and the source area 218. The P-type impurity diffusion layer (202 of FIG. 12) below the string selection gate 312 and the ground selection gate 316 correspond to channel diffusion layers 202a of the string selection transistor and the ground selection transistor, respectively. The inversely doped area (304 of FIG. 12) below the wordlines 214 and the P-type impurity diffusion layer (202 of FIG. 12) below the wordlines 214 correspond to a channel diffusion layer 304a and an anti-punchthrough diffusion layer 202b of the memory transistor, respectively. Using a conventional manner of forming a NAND-type cell array, a common source line (226 of FIG. 10) coupled to the source area 218, a bitline plug (228 of FIG. 10) coupled to the bitline area 220, and a bitline (230 of FIG. 10) coupled to the bitline plug (228 of FIG. 10) may be formed.

In the first embodiment, because the channel diffusion layer is inversely doped with N-type impurities, the memory transistor may have a negative threshold voltage. The third embodiment is unlike the first embodiment because the string selection transistor and the ground selection transistor have a positive threshold voltage. Thus, they are turned on when a positive voltage is applied to a gate. The third embodiment is unlike the second embodiment because the string selection transistor and the ground selection transistor include a gate insulating layer instead of a multi-layered charge storage layer. Thus, it is possible to overcome the disadvantage of a varying threshold voltage due to charges trapped at the multi-layered charge storage layer.

Since the memory transistors have an initially negative threshold voltage, their data can be read out under conditions when a read voltage is 0V.

In summary, a NAND-type cell array is formed using a depletion mode SONOS memory transistor having a multi-layered charge storage layer. A non-volatile memory device according to the invention does not need a circuit for generating a read voltage because it can read out data under conditions when a read voltage is 0V. Thus, areas of peripheral circuits are reduced to heighten the ratio of cell area to peripheral circuit area. Furthermore, a read voltage may be lowered as compared to a conventional NAND-type SONOS memory device, which makes it possible to prevent a transistor in an erase state from being soft-programmed by an erase voltage.

What is claimed is:

1. A method of fabricating a non-volatile memory device comprising:
   forming a diffusion layer of a first conductive type on a predetermined area of a substrate of the first conductive type;
   implanting impurities of a second conductive type on a predetermined area of the diffusion layer, thereby forming an inversely doped area on a surface of the diffusion layer;
   forming a string selection gate, a plurality of wordlines, and a ground selection gate over a predetermined area of the diffusion layer; and
   forming junction areas in the substrate adjacent to both sides of the string selection gate, both sides of every one of the plurality of wordlines, and both sides of the ground selection gate, wherein every one of the wordlines includes a charge storage layer and a memory gate electrode which are sequentially stacked on the substrate, and wherein at least the wordlines are formed over the inversely doped area.

2. The method of claim 1, wherein the diffusion layer is more heavily doped than the substrate.

3. The method of claim 1, wherein the inversely doped area is of the second conductive type.

4. The method of claim 1, wherein the inversely doped area is of the first conductive type but is more lightly doped than the substrate.

5. A method of fabricating a non-volatile memory device, comprising:
   implanting impurities of a first conductive type into a predetermined area of a substrate of the first conductive type, thereby forming a diffusion layer of the first conductive type;
   implanting impurities of a second conductive type into a surface of the diffusion layer, thereby forming an inversely doped area;
   forming a plurality of stack patterns on the substrate;
   forming device isolation layers between the plurality of stack patterns, wherein each of the stack patterns is made by sequentially stacking a charge storage layer and a lower gate conductive layer;
   forming an upper gate conductive layer covering the stack pattern and the device isolation layer;
   patterning at least the upper and lower gate conductive layers to form a string selection gate electrode, a plurality of memory gate electrodes, and a ground selection gate electrode that are horizontally positioned to cross the device isolation layers; and
   implanting impurities of a second conductive type into surfaces of the substrate adjacent to the sides of the string selection gate electrode, memory gate electrodes, and the ground selection gate electrode to form junction areas.

6. The method of claim 5, wherein the inversely doped area is of the first conductive type but more lightly doped than the substrate.

7. The method of claim 5, wherein the inversely doped area is of the second conductive type.

8. The method of claim 5, further comprising:
   applying a high electric field between the string selection gate electrode and the substrate and between the ground selection gate electrode and the substrate; and
   accumulating negative charges in a charge storage layer interposed between the string selection gate electrode and the substrate and in a charge storage layer interposed between the ground selection gate electrode and the substrate.

9. A method of fabricating a non-volatile memory device, comprising:
   implanting impurities of a first conductive type into a predetermined area of a substrate of a first conductive type to form a diffusion layer of a first conductive type;
   implanting impurities of a second conductive type into a predetermined area of the diffusion layer to form an inversely doped area;
   forming a plurality of stack patterns on the substrate;
   forming device isolation layers between the stack patterns, wherein each of the stack patterns is made by sequentially stacking a charge storage layer and a lower gate conductive layer;

forming an upper gate conductive layer covering the stack pattern and the device isolation layers;

sequentially patterning at least the upper and lower gate conductive layers to form a string selection gate electrode, a plurality of memory gate electrodes, and a ground selection gate electrode that are horizontally positioned to cross the device isolation layers; and implanting impurities of the second conductive type into the substrate adjacent to the sides of the string selection gate electrode, every one of the plurality of memory gate electrodes, and the ground selection gate electrode to form junction areas, wherein the string selection gate electrode and the ground selection gate electrode are positioned over the difflusion layer, and the plurality of memory gate electrodes are positioned over the inversely doped area.

10. The method of claim 9, wherein the inversely doped area is of the first conductive type but more heavily doped than the substrate.

11. The method of claim 9, wherein the inversely doped area is of the second conductive type.

12. A method of fabricating a non-volatile memory device, comprising:

implanting impurities of a first conductive type into a predetermined area of a substrate of a first conductive type to form a diffusion layer of a first conductive type;

implanting impurities of a second conductive type into a predetermined area of the diffusion layer to form an inversely doped area;

forming a plurality of stack patterns on the first conductive type substrate;

forming device isolation layers between the stack patterns, wherein each of the stack patterns is made by sequentially stacking a charge storage layer and a lower gate conductive layer;

forming an upper gate conductive layer covering the stack patterns and the device isolation layers;

sequentially patterning at least the upper and lower gate conductive layers to form a string selection gate electrode, a plurality of memory gate electrodes, and a ground selection gate electrode that are horizontally positioned over the device isolation layers; and implanting impurities of the second conductive type into a surface of the substrate adjacent to the sides of the string selection gate electrode, memory gate electrodes, and the ground selection gate electrode to form junction areas, wherein the charge storage layer is interposed between the memory gate electrodes and the substrate, and wherein a gate insulating layer is interposed between the active region and the string selection gate electrode and between the active region and the ground selection gate electrode.

13. The method of claim 12, wherein the inversely doped area is of the first conductive type and more lightly doped than the substrate.

14. The method of claim 12, wherein the inversely doped area is of the second conductive type.

* * * * *

UNITED STATES PATENT AND TRADEMARK OFFICE
CERTIFICATE OF CORRECTION

PATENT NO. : 6,881,626 B2
APPLICATION NO. : 10/866467
DATED : April 19, 2005
INVENTOR(S) : Lee et al.

It is certified that error appears in the above-identified patent and that said Letters Patent is hereby corrected as shown below:

On the Cover Page item [75] under Inventors, "Chany-Hyun Lee" should read --Chang-Hyun Lee--.

Signed and Sealed this

Sixteenth Day of January, 2007

JON W. DUDAS
*Director of the United States Patent and Trademark Office*